(12) United States Patent
Gaughan et al.

(10) Patent No.: US 6,210,745 B1
(45) Date of Patent: Apr. 3, 2001

(54) METHOD OF QUALITY CONTROL FOR CHEMICAL VAPOR DEPOSITION

(75) Inventors: Kevin Gaughan, Los Gatos; Ching-Wei Chen, Sunnyvale; Minxu Li, Hollister, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/349,556

(22) Filed: Jul. 8, 1999

(51) Int. Cl.$^7$ .................................................... C23C 16/52
(52) U.S. Cl. ................................. 427/8; 427/9; 427/248.1; 427/255.394; 438/14
(58) Field of Search ................................. 427/8, 9, 248.1, 427/255.394; 438/14

(56) References Cited

U.S. PATENT DOCUMENTS

| | | | |
|---|---|---|---|
| 4,388,342 | * | 6/1983 | Suzuki et al. . |
| 4,857,136 | * | 8/1989 | Zajac . |
| 5,754,297 | | 5/1998 | Nulman .............................. 356/381 |

OTHER PUBLICATIONS

NDT Updated, vol. 8, No. 2, (Feb. 1999).*
Raaijmakers et al., Applied Surface Science, vol. 73, (1993), pp. 31–41 (no month).*
Chowdhury et al., J. Vac. Sci. Technol. B vol. 15, No. 1, Jan./Feb. 1997, pp. 127–132.*
Tedder, et al. "Real–Time Process And Product Diagnostics In Rapid Thermal Chemical Vapor Deposition Using In Situ Mass Spectrometic Sampling", J. Vac. Sci. Technol. B 13(4), Jul./Aug. 1995; pp. 1924–1927.
Chowdhury, et al. "Real–Time Process Sensing And Metrology In Amorphous And Selective Area Silicon Plasma Enhanced Chemical Vapor Deposition Using In Situ Mass Spectrometry" J. Vac. Sci. Technol. B 15(1), Jan./Feb. 1997; pp. 127–132.

* cited by examiner

Primary Examiner—Timothy Meeks
(74) Attorney, Agent, or Firm—Limbach & Limbach L.L.P.

(57) ABSTRACT

A residual gas analyzer can be used as a deposition rate monitor. A deposition rate monitor is based on the detection of growth precursors and reaction byproducts of the thin film growth in deposition equipment such as chemical vapor deposition (CVD) systems. The growth precursors and byproducts are identified and quantified by using a residual gas analyzer (RGA). The ion current from gas species associated with the growth rate is then empirically correlated with the thickness of the film. The specific chemical species detected by the RGA is unique to the material that is deposited and to the technique in which the material is deposited.

16 Claims, 9 Drawing Sheets

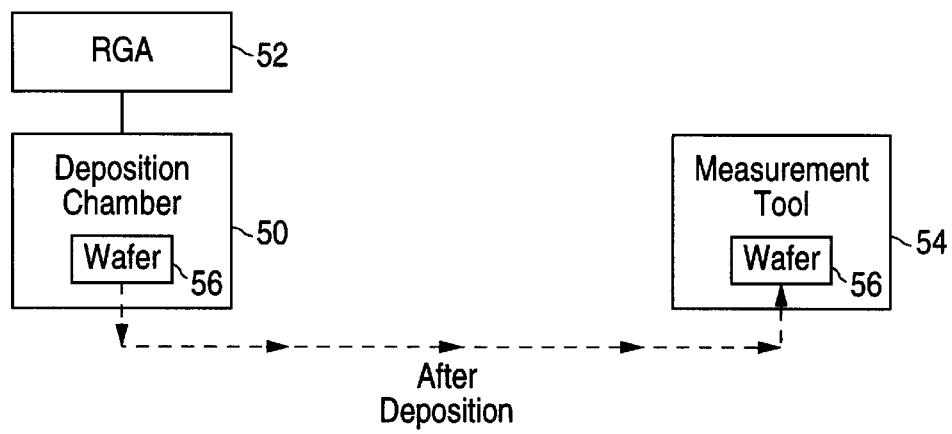
FIG. 1
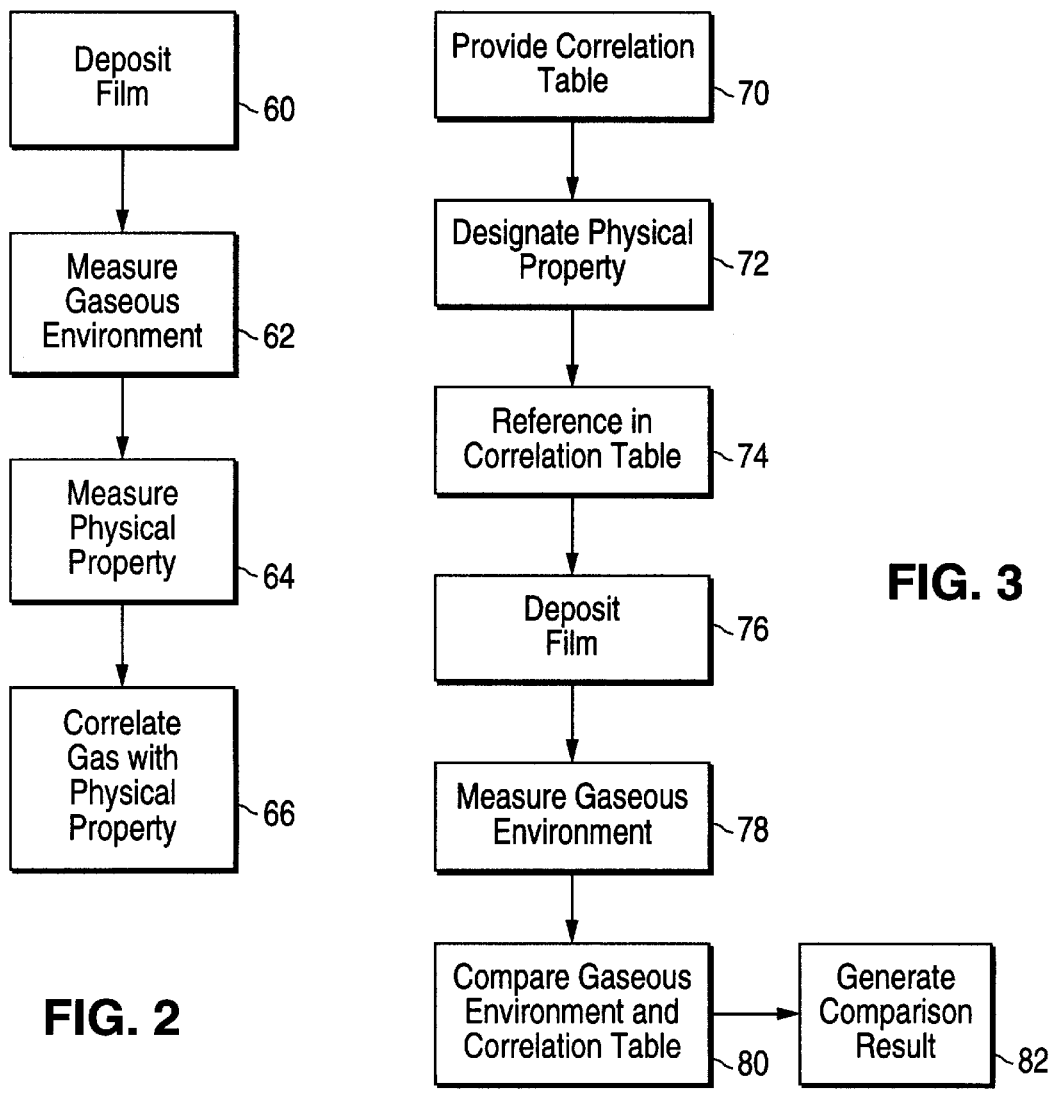
FIG. 2
FIG. 3

METHOD OF QUALITY CONTROL FOR CHEMICAL VAPOR DEPOSITION

BACKGROUND OF THE INVENTION

1. Field of the Invention

The present invention relates to measurements of thin films deposited during a chemical vapor deposition. In particular, the invention relates to measuring a gaseous environment during deposition. The invention is used as a quality control monitor during the deposition process.

2. Description of the Related Art

The integrated circuit industry uses thin films of titanium nitride (TiN) for many applications. One application of TiN films is as a diffusion barrier, and glue layer for submicron contacts and vias. It prevents the inter-diffusion of silicon and aluminum in an aluminum plug process. TiN also serves as a glue layer for the tungsten plug process and it prevents $WF_6$ from attacking the underlying metal or silicon during tungsten deposition. As contact and via windows shrink, physical vapor deposition techniques for depositing TiN are being replaced by chemical vapor deposited (CVD) TiN to meet step coverage requirements for contacts and vias below 0.35 $\mu$m.

The CVD deposited TiN films provide better step coverage than sputtered TiN films for via and contacts opening below 0.5 microns. The CVD TiN process studied in this application resulted from the thermal deposition of tetrakis (dimethylamido) titanium (TDMAT), optionally followed by post deposition plasma treatment.

Deposition rate monitoring techniques often are performed by reiterative techniques and require test wafers. In typical film deposition processes, one or more test wafers are measured to determine if the process is within normal parameters. In most cases the parameters of interest are measured after the film has been deposited on the substrate. If the measured parameters are not within the desired tolerances, the process parameters are adjusted and more test wafers are measured to assure process compliance. The qualification procedure is generally repeated periodically to assure stable performance, in some cases on a weekly or daily basis. Between the qualification tests, the process tool must be assumed to be stable.

However, the reiterative technique described above has a number of disadvantages. It is time consuming and inefficient compared to real time deposition rate monitoring techniques. Reiterative techniques require test wafers to be created instead of product wafers. Test wafers cannot be sold and therefore displace the revenue stream generated by the production of product wafers.

In addition to the down time of the deposition chamber while the test wafers are being made, the deposition chamber must remain idle while conformance measurements are made on the completed test wafers.

Furthermore, test wafers allow the detection of errors only once the test wafers have been made and measured. If the test wafer process is performed only once every twenty-four hours, and the deposition chamber defect has occurred twenty-three hours ago, then approximately 96% of the production wafers made that day are defective.

These problems suggest that real time, in situ process monitoring should be used instead of the test wafer reiterative monitoring process. With optical in situ monitoring, either the detector itself must be within the deposition chamber or it must have a window. However, when the deposition is performed, deposited films also coat other things within the chamber, including the detector or the inside surface of the window. This obscures the optical measurements. Thus, there is a need for non-optical in situ process monitoring.

Furthermore, there is a need to monitor the input gases of the deposition process to ensure that the mass flow controller is working properly.

SUMMARY OF THE INVENTION

The present invention addresses these and other problems of the prior art by providing methods for in-situ, real-time quality monitoring of chemical vapor deposited films.

According to one embodiment, a method according to the present invention correlates resulting gaseous environments in a CVD reactor with physical properties of deposited films. The method includes the steps of depositing a film in the CVD reactor at a selected temperature utilizing a selected input gaseous mixture; measuring a resulting gaseous environment in the CVD reactor as a result of the depositing step; and measuring a physical property of the deposited film. The method further includes the step of correlating one or more gas species in the resulting gaseous environment, the selected temperature, and the selected input gaseous mixture with the physical property to identify a relationship therebetween.

According to another embodiment, a method according to the present invention monitors depositions of films in a CVD reactor. The method includes the steps of providing a correlation table between a plurality of temperatures, a plurality of input gaseous mixtures, a plurality of physical properties of deposited films, and a plurality of resulting gaseous environments; designating a physical property of a film to be deposited; and referencing with the correlation table a selected one of the plurality of temperatures, a selected one of the plurality of input gaseous mixtures, and a range of one or more gas species of the plurality of resulting gaseous environments in accordance with the designated physical property. The method further includes the steps of depositing the film in the CVD reactor at the selected temperature utilizing the selected input gaseous mixture; and measuring one or more gas species in a resulting gaseous environment in the CVD reactor that results from the depositing step. The method still further includes the steps of comparing the measured one or more gas species in the resulting gaseous environment and the range of one or more gas species; and generating a comparison result in accordance with the comparing step. The comparison result indicates a difference between the designated physical property and an actual physical property resulting from the depositing step.

A better understanding of the features and advantages of the present invention will be obtained by reference to the following detailed description and accompanying drawings which set forth illustrative embodiments in which the principles of the invention are utilized.

BRIEF DESCRIPTION OF THE DRAWINGS

FIG. 1 is a block diagram of the equipment used in the present invention.

FIG. 2 is a flowchart of a correlation process according to an embodiment of the present invention.

FIG. 3 is a flowchart of a monitoring process according to another embodiment of the present invention.

DETAILED DESCRIPTION OF THE PREFERRED EMBODIMENTS

RGA Background and Overview

Figure 4A:
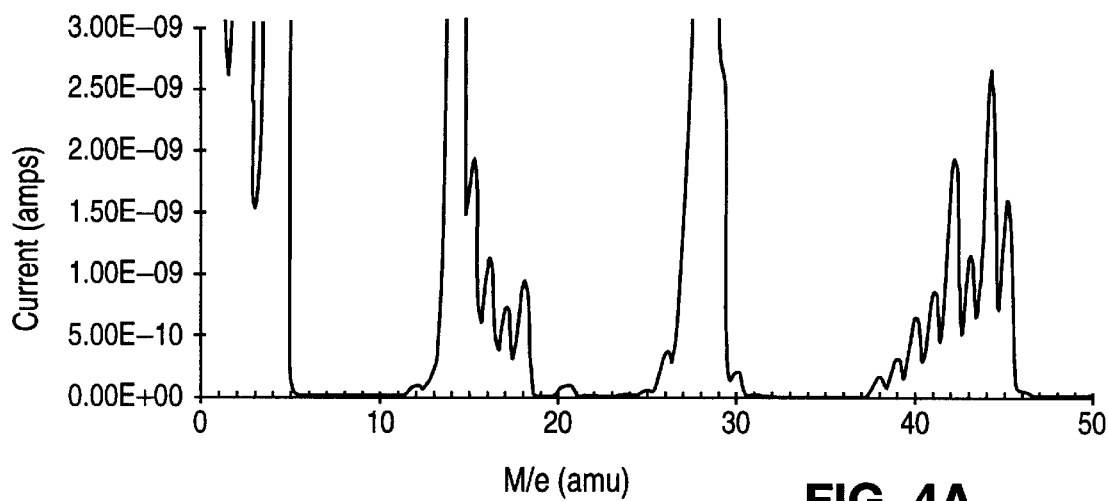
FIGS. 4A–4C are plots of ion current versus atomic mass resulting from a deposition.

A residual gas analyzer (RGA) analyzes gases by ionizing some of the gas molecules, separating the ions by mass, and measuring the quantity of ions at each mass. In general there are many mass sampling techniques available such as selected peak scan or analog scan. The selected peaks scan only looks at the user-specified peaks and the analog scan looks at all peaks within a prescribed range. Looking at the signal detected for each mass identifies the gas molecules. The magnitude of the ion current as measured by the RGA is used to determine the partial pressure of the respective gases.

In a chemical vapor deposition, the amounts and ratios of various gases in the deposition chamber change during the deposition process. This suggests that the RGA may be used as a deposition rate monitor. However, an RGA must satisfy at least three requirements in order to be used as a real-time deposition rate monitor.

First, the RGA data should be associated with the gaseous environment of the reactor. Each process is unique and a specific set of peaks must be determined. This requirement is complicated by the fact that in many cases the exact gaseous species involved in the deposition are not widely known. The CVD TiN deposition rate monitor used a selected peak mode scan. The peaks selected to monitor the process were determined through experiment. It is difficult to know beforehand which peaks to monitor. Experiments need to be performed and qualitative empirical relationships must be determined.

Second, the selected peaks should be associated with the growth mechanism. The peaks monitored by the RGA must be selected and cause and effect relationships must be determined that are meaningful in describing the growth mechanism within the reactor.

Third, the RGA should respond quickly to changes within the growth reactor. The overall time constant of the RGA sampling system should be fast enough to track changes in the deposition process. The RGA time constant is determined by toggling the inlet valve and studying the decay or rise time of the signal.

This application details how an RGA may be used for deposition rate monitor while satisfying the above three concerns. Initially, the advantages of the present invention and the equipment arrangement are described. Then, the application gives an overview of a method used to correlate RGA data with deposited film properties, and a method to use the correlation for deposition process monitoring. Finally, the application provides the details involved in developing these methods.

Using an RGA for deposition monitoring as described in this application has a number of advantages over process monitoring using test wafers.

The RGA system can be used to improve process control by employing real time, in situ monitoring of process metrics. In situ measurements are performed to ensure that process parameters, such as gas flow, pressure, gas ratios, and gas purity are within normal limits. Improving process monitoring can reduce manufacturing cost, because semiconductor devices are very complex and each process step represents a large investment of time and energy. Critical wafer processing steps may be monitored to reduce the risk of exposing product to processes that are out of control.

In addition, no test wafers are required and the deposition can be monitored on production wafers on a continuous basis. This eliminates the down time involved with test wafer production and measurement. All operations of the deposition chamber then contribute directly to the revenue stream.

Another advantage of the RGA process monitoring technique is that gas flows and pressures can be monitored and compared to a desired set point. For example, the RGA can be employed to confirm that gas flow controllers are performing properly. Detailed information obtained by the RGA can then be used to troubleshoot out of control processes.

Furthermore, by measuring gases instead of film thickness directly, this overcomes the need to have a clear viewing port.

Finally, the deposition rate monitoring method can be incorporated into a deposition rate control system. Information from the RGA deposition rate monitor system can improve process control. Parameters that effect growth rate can be adjusted, such as gas flows, pressures and temperatures. Deposition rate control may be implemented by reducing the error signal between a desired deposition rate and the real time deposition rate determined by the RGA. Deviations from normal operation can be identified on a real time basis by using the RGA.

Equipment Configuration

FIG. 1 is a block diagram of the equipment configuration according to an embodiment of the present invention, including a deposition chamber 50, an RGA 52. and a measurement tool 54.

The deposition chamber 50 used was a TiN CVD module TxZ from Applied Materials. The RGA 52 used was a Leybold Inficon RGA of closed ion source (CIS) type. The RGA 52 was mounted on the deposition chamber 50. The RGA 52 has its own pumping package and two orifices of different size in the inlet valve for pressure reduction. The pressure differential between the process chamber and the CIS manifold (where the quadrupole filter is located) is approximately $10^5$ to 1 when the smaller orifice is used and approximately $10^3$ to 1 when the larger one is used. With the larger orifice (noted as 10 mTorr orifice), the CIS is used to sample chamber background gases. With the smaller orifice (noted as 1 Torr orifice), it is used to sample the process. For this work, the electron energy was 10 to 70 eV and the electron emission current was 0.2 to 2.0 mA. For high sensitivity, the RGA 52 was operated in electron multiplier mode (as opposed to Faraday mode) and the voltage applied to the electron multiplier was set to a value between 1350 and 2100 V. The dwell time for each peak was 16 ms. Each scan took 0.469 s to complete.

Two types of measurement tools 54 were used depending upon the physical property to be measured. Optical measurements of film thickness were performed on either the Tencor UV-1250 or UV-1280. This is an automated tool which is a spectral ellipsometer and reflectometer combination. Optical constants of CVD TiN films were modeled using a Lorentz oscillator. Optical parameters were extracted based on fit of a model to the measured data. Sheet resistance measurements of the film were measured on a Tencor Rs-55, an automated four point probe measurement tool. All measurements were performed within one hour after breaking vacuum. More specifically, a film was deposited on a wafer 56 in the deposition chamber 50 and the RGA 52 measured the resulting gaseous environment. Then the wafer 56 was removed from the deposition chamber 50 for measurements performed by the measurement tool 54.

In the processes, parameters such as He carrier flow and heater temperature of the CVD TiN process were varied, and RGA data and optical thickness were measured. Not all of the experiments were run on the same day. No attempt to normalize the RGA data was done for experiments that were performed on different days.

Creating the Correlation Table

FIG. 2 is a flowchart of the general steps of the correlation process. The correlation process correlates resulting gaseous environments in the deposition chamber 50 (see FIG. 1) with physical properties, such as thickness and sheet resistance, of the deposited films.

In step 60, the deposition chamber 50 deposits a film of TiN at a selected temperature and utilizing a selected input gaseous mixture. Various temperatures and gaseous mixtures were used in developing the correlation, as further detailed below.

In step 62, the RGA 52 (see FIG. 1) measures a resulting gaseous environment in the deposition chamber 50 as a result of the depositing step 60.

In step 64, the measurement tool 54 (see FIG. 1) measures a physical property of the deposited film.

In step 66, one or more gas species in the resulting gaseous environment, the selected temperature, and the selected input gaseous mixture are correlated with the measured physical property to identify a relationship therebetween. As further detailed below, this process has identified a correlation between a number of gas species and physical properties of the deposited films.

Once the correlation process of FIG. 2 has been performed for a variety of temperatures and input gaseous mixtures, a correlation table may be developed.

Process Monitoring

FIG. 3 is a flowchart of the general steps of the monitoring process that can be performed once the correlation table has been developed.

In step 70, the correlation table is provided. This correlation table is as developed using the flowchart of FIG. 2.

In step 72, a physical property of a film to be deposited is designated. This physical property may be a film thickness value.

In step 74, the physical property designated in step 72 is used to reference in the correlation table a selected temperature and a selected input gaseous mixture. This referencing also indicates a range of gas species that would be expected to result after a film has been deposited with the selected temperature and the selected input gaseous mixture with the designated physical property.

In step 76, the deposition chamber 50 (see FIG. 1) deposits the film at the selected temperature utilizing the selected input gaseous mixture.

In step 78, the RGA 52 (see FIG. 1) measures a resulting gaseous environment in the deposition chamber 50 as a result of the depositing step 76.

In step 80, the resulting gaseous environment from step 78 is compared with the range of gas species from step 74.

In step 82, a comparison result is generated based on step 80. The comparison result indicates a difference between the designated physical property and an actual physical property resulting from the depositing step 76. That is, if the resulting gaseous environment is within the range, then the actual physical property is within tolerable levels of the designated physical property. On the other hand, if the resulting gaseous environment is outside the range, then the actual physical property is outside tolerable levels of the designated physical property. In such a case the process indicates that the wafer is outside of specifications.

In addition, for successive depositions, the comparison results of step 82 may be statistically analyzed for statistical process control. For example, if the resulting gaseous environments are within the range, but are steadily increasing toward the upper limit of the range, then this indicates that the depositions may soon be out of range. This information may then be used to recalibrate the deposition chamber or otherwise determine the cause of the increase.

Detailed Introduction

In general, CVD processes can be characterized as mass transport limited, reaction rate limited, or some combination of both. The validity and accuracy of the RGA sampling technique depends upon whether the growth process is reaction rate or mass transport limited. The deposition process should be understood and the importance of the gas flows and substrate temperature on growth rate should be quantified.

The RGA recipe should be tailored to avoid a number of effects. The electron multiplier (EM) voltage should be adjusted so that the ion current is linearly proportional to the gas flow. The ion current for each mass should be less than $10^{-6}$ amps, which is below saturation region of electron multiplier. The differential pumping system should be tailored to the deposition pressure of the reactor to avoid overpressure in the RGA. Finally, the electron energy should be adjusted to a sufficient energy to ionize the gas in a predictable manner; i.e., the cracking pattern of gas species depends upon electron energy.

In the methods further detailed below, the EM voltage was adjusted so that the ion current was linearly proportional to the gas flow and that the ion current did not exceed $10^{-6}$ amps. The inlet valve aperture was chosen such that the total pressure in the RGA manifold was less than $10^{-4}$ Torr under all test conditions. For the CVD TiN process, a 1 Torr aperture was used, and the maximum process pressure was 5 Torr. The cracking pattern of the growth precursors was characterized as a function of electron energy. The electron energy was chosen such that the cracking pattern for each growth precursor was consistent from day to day. For normal monitoring of the CVD TiN process, the electron energy was between 35 to 70 eV.

In addition, the location of the RGA sensor is important to success. The gas sampling method should sample from the deposition transport region and the RGA sensor should not introduce sampling artifacts or diffusion delay. In some cases, the walls of the chamber and the RGA sampling line may be heated to avoid diffusion delay of the growth precursor.

Data interpretation methods and techniques are complex. A variety of tests should be performed, such as deposition parameter dependencies, metrology gauge studies, RGA sampling-related effects, and data interpretation and analysis. The spectrum obtained will be a composite of the individual substances, which together make up the actual sample present. Each gas species has its own cracking pattern depending upon the ionization process, isotope ratios and electron energy effects. Several experiments were performed to understand the fundamental process and the dependence of film properties on deposition parameters.

Data analysis and error reduction techniques are also important to the success of the RGA as a deposition rate monitor. Several error reduction strategies were used such as the following: 1) inert gas markers, 2) electron multiplier normalization, and 3) data averaging. Inert gas markers provide information about the process sequence and the timing of each step in the process. These markers provided the roadmap of the RGA data. Each process recipe is unique and has several steps.

This application sets forth a study of the CVD TiN process, in particular the deposition process in which TDMAT is thermally decomposed onto the hot substrate. The CVD process is a balance between mass transport of the growth precursor and the reaction rate at the growing surface. Typically, mass transport processes are driven by flow, pressure and reactor design while in the case of reaction rate limited processes wafer temperature dictates film growth kinetics. Typically, in low-pressure CVD reactions, such as the CVD TiN process, the process is designed to be reaction rate limited and temperature control is optimized.

Helium carrier gas flow and substrate temperature were varied and optical thickness and RGA data were recorded. As expected, deposition rate and deposition uniformity are strongly dependent upon both varied parameters and that the RGA can be employed to track these variations. Both mass transport and reaction rate limited deposition are seen, as detailed below. Process parameters have been mapped and the reaction rate limited regime has been identified. Reaction rate limited growth is recommended because it minimizes the uniformity across the wafer.

The methods described in the present application show that an RGA deposition rate monitor technique may be used in the CVD TiN process. The CVD TiN process resulted from the thermal deposition of tetrakis (dimethylamido) titanium (TDMAT) followed by post deposition plasma treatment. The deposition process was examined as a function of TDMAT flow and substrate temperature. In particular, an RGA was employed to study the gaseous environment during film growth. Byproducts of the thermal decomposition of TDMAT were identified. A correlation was found between the RGA ion current for selected peaks and the thin film deposition rate. The peak intensities at masses 44, 42, 41, 15, 67, 54, and 106 atomic mass units (amu) are associated with the fragmentation of TDMAT by the RGA, and the thermal decomposition of TDMAT. Appearance energy studies and peak ratio plot calculations indicate that acetonitrile, dimethylamine and ethylenimine are byproducts of the CVD TiN deposition process. Changing the TDMAT flow rate and the substrate temperature varied the deposition rate. RGA peaks associated with the above-mentioned hydrocarbon gas species increase monotonically as a function of the deposition rate. This correlation is important because it shows that the RGA may be used as a real time in-situ monitor of the CVD TiN deposition rate.

The ability of the RGA to respond to changes in the growth environment is directly proportional to the scan rate of the RGA. The scan rate is determined by three factors: 1) total number of peaks, 2) dwell time, and 3) peak lock option. The total number of peaks was reduced in order to provide a quick scan time while providing a large amount of information about the process. The dwell time was optimized to provide a good signal to noise ratio and a quick scan time. For example, in a CVD TiN process there are 24 steps and the minimum step time is 3 seconds. The scan rate of the CVD TiN process was less than 1 second. The peak lock option was turned off to reduce the overall scan time. Tuning calibrations were checked frequently.

The ion current from the inert gas markers provides information for the normalization of ion current. Normalization and/or daily calibrations of the electron multiplier gain are recommended. The drift of electron multiplier should be reduced in order to provide accurate results. RGA vendors such as Inficon provide automated electron multiplier calibration techniques. One strategy for ion current normalization is to adjust the multiplier gain in order to achieve a fixed ion current.

RGA Spectra of CVD TiN Process

CVD TiN films are deposited by thermally decomposing TDMAT, carried by helium carrier gas, onto a heated wafer surface. Process gases and the byproducts of the deposition are monitored by the RGA. The thermal decomposition is expressed as

$$Ti[N(CH_3)_2]_4 \rightarrow TiN(C_xH_y) + HN(CH_3)_2 + \text{other hydrocarbons}$$

The mass spectrum for each gas species is unique, because of elemental composition and fragmentation of the ionized molecules.

Figure 4B:
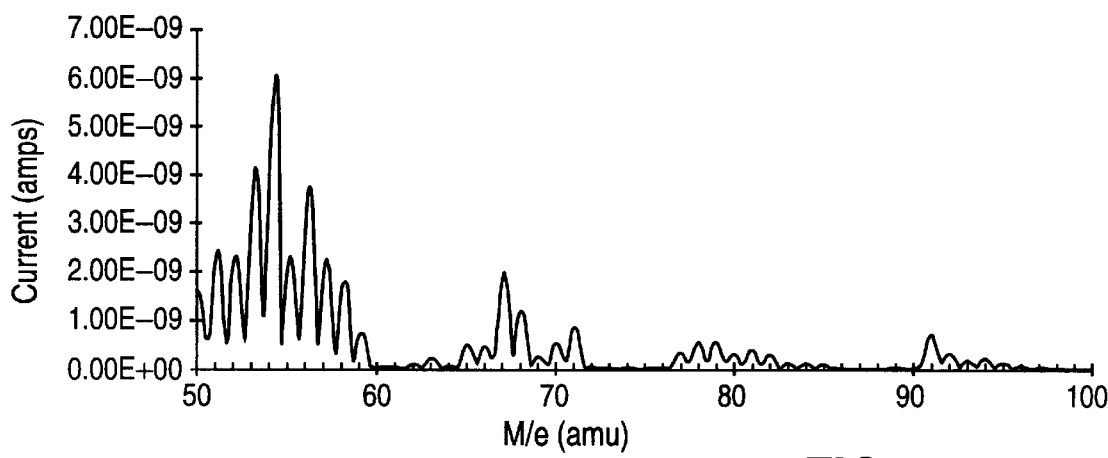
Figure 4C:
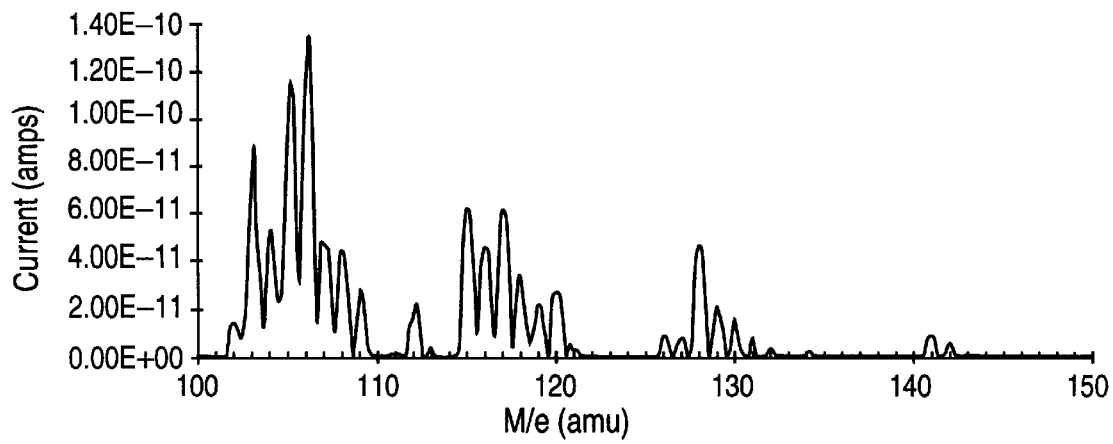

FIGS. 4A–4C shows the mass spectra from 0 to 150 atomic mass units (amu) of the thermal decomposition of TDMAT in the CVD reactor. The electron energy and electron emission are 70 eV and 2.0 mA, respectively. The electron multiplier voltage was 1360 V in FIG. 4A and 2200 V in FIGS. 4B–4C. The electron multiplier voltage was increased to amplify the ion current for masses greater than 50 atomic mass units (amu). In general, the fragmentation pattern is complex and involves many hydrocarbons and organometallic compounds.

In FIG. 4A, inert gas species such as helium, hydrogen and nitrogen are detected. Helium and nitrogen are introduced as part of the CVD TiN process while hydrogen is as a result of the fragmentation of TDMAT. Mass peaks between 39 to 45 amu are believed to result from dimethylamine ($NC_2H_7$), ethylenimine ($NC_2H_5$), and acetonitrile ($NC_2H_3$). Peaks in the mass range between 50 to 150 amu are difficult to assign unambiguously.

In the first several deposition steps, to uniformly heat wafers to the desired temperature, $N_2$ and He gases are introduced into the chamber. In the deposition step, He is the carrier gas for TDMAT, the precursor of the TiN CVD process. The decomposition generates byproduct dimethylamine ($NC_2H_7$), ethylenimine ($NC_2H_5$), and acetonitrile ($NC_2H_3$) as well as $H_2$ and other hydrocarbons. In the plasma treatment step following the deposition, $H_2$ and $N_2$ are introduced into the chamber and once the plasma power is turned on, ammonia ($NH_3$) is generated. In general, approximately 100 Å of CVD TiN film are deposited followed by a plasma treatment, The overall thickness of the film may be controlled by repeating the deposition/plasma treatment process.

The process sequence may be monitored by looking at mass peaks from the inert source gases ($N_2$, He, $H_2$). Process monitoring is performed by inspection of mass peaks associated with reaction byproducts whether in the deposition step or in the plasma treatment step. The intensity of these latter mass peaks could reveal information about the deposition rate in the deposition step and the variation of their intensity with time the progress of the plasma treatment in the plasma step. Ultimately, this information can be used for process diagnostics and statistical process control.

Figure 5A:
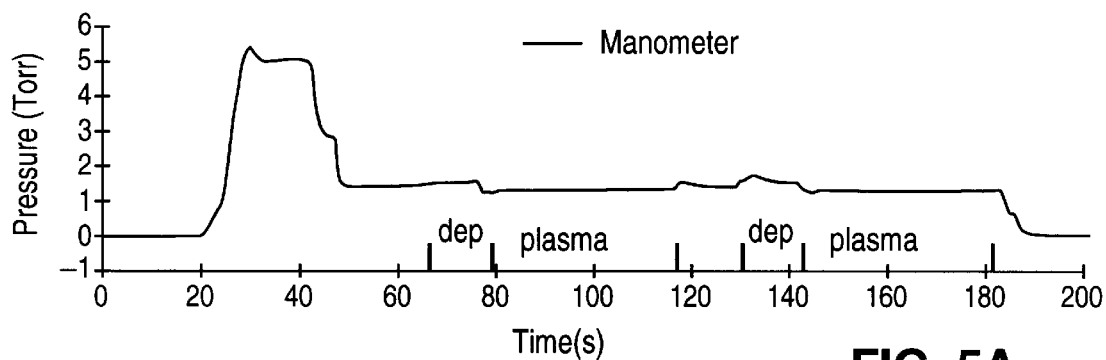
FIGS. 5A–5D are plots of various measurements versus time resulting from a deposition process.
Figure 5B:
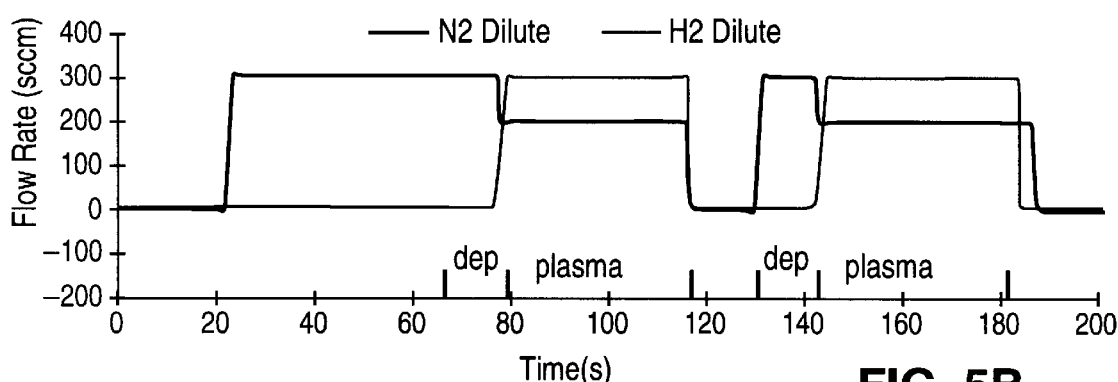

FIGS. 5A–5D show plots of gas flow, chamber pressure, and plasma power for a two layer process, in which film material is deposited and then plasma treated. The zero time is defined as the time when the wafer enters the chamber. For clarity, only deposition and plasma treatment steps are identified on the graph. As shown in FIGS. 5A–5D, there are two deposition-plasma cycles. Each cycle deposits 100 Å of untreated CVD TiN film. The film thickness decreases by a factor of about 2 after plasma treatment. The chamber pressure is indicated by a manometer and is controlled by setting the throttle valve position and gas flows. Initially the pressure goes up to 5 Torr and then decreases to between approximately 1.3 to 1.5 Torr during the rest of the process as shown in FIG. 5A. The wafer is heated to 450° C. during the time when the chamber is pressurized to 5 Torr. FIG. 5B shows the flow rates of $N_2$ dilute gas and $H_2$ dilute gas. When the process shifts from deposition to plasma treatment, the $N_2$ flow rate changes from 300 sccm to 200 sccm. Following the first plasma cycle, the $N_2$ dilute flow is turned off and is again set to 300 sccm when the second deposition cycle starts. The $H_2$ flow of 300 sccm is turned on only during plasma treatment.

Figure 5C:
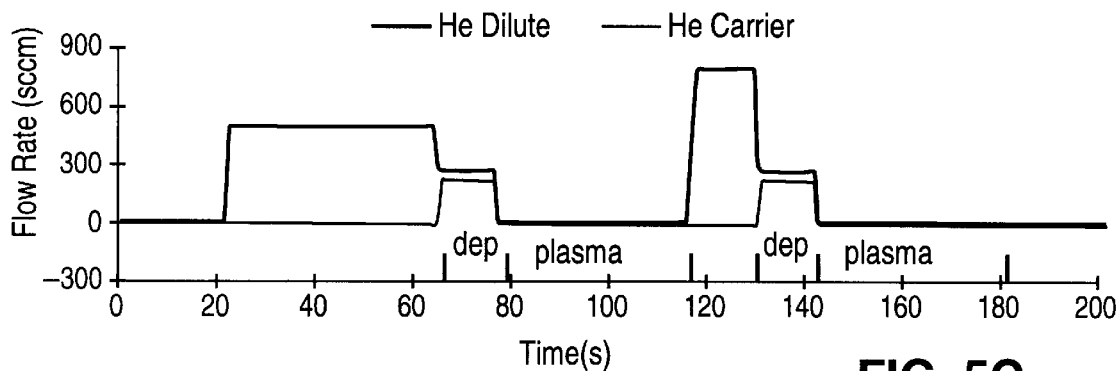
Figure 5D:
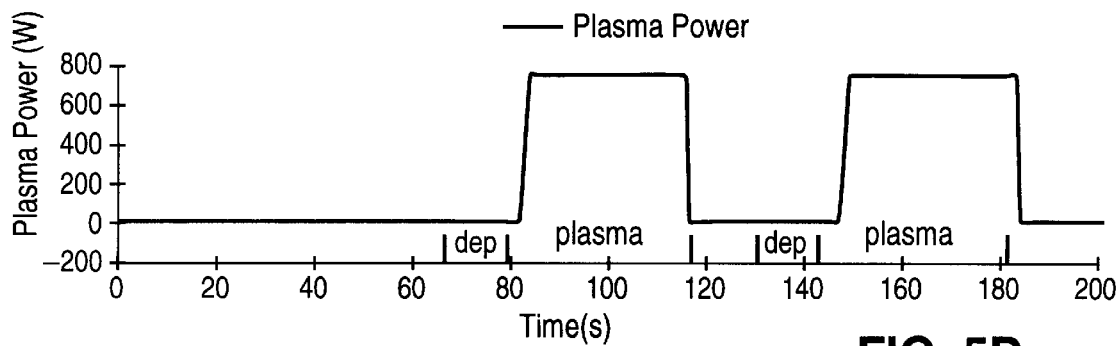

When the first deposition cycle starts, the He dilute flow changes from 500 sccm to 275 sccm while the He carrier flow changes from 0 sccm to 225 sccm, keeping the sum of He flows the same, as shown in FIG. 5C. Following the first plasma cycle, the He dilute flow is increased to 800 sccm for rapid cooling of the wafer after it has been heated up in the previous plasma step. When the second deposition cycle starts, He dilute flow is again set to 275 sccm and the He carrier flow is 225 sccm. Radio frequency plasma power is 750 W, and it is shown in FIG. 5D.

To use the RGA to monitor the trend in the concentrations of major species involved, an RGA data collection recipe in selected peak mode is created. It includes mass peaks that come from source gases, such as the peaks at mass 28 amu ($N_2^+$), mass 2 amu ($H_2^+$) and mass 4 amu ($He^+$). It also includes mass peaks that originate from reaction byproducts. As mentioned previously, during deposition the gases dimethylamine, acetonitrile, and ethylenimine are generated as byproducts of TDMAT decomposition. These byproducts give rise to peaks at masses 45 amu ($NC_2H_7^+$), 44 amu ($NC_2H_6^+$), 43 amu ($NC_2H_5^+$), 42 amu ($NC_2H_4^+$), 41 amu ($NC_2H_3^+$), 40 amu ($NC_2H_2^+$), 16 amu ($CH_4^+$), 15 amu ($CH_3^+$), and mass 2 amu ($H_2^+$). During plasma treatment, ammonia is created in the $H_2/N_2$ plasma, resulting peaks at 17 amu ($NH_3^+$), 16 amu ($NH_2^+$), and 15 amu ($NH^+$).

Figure 6A:
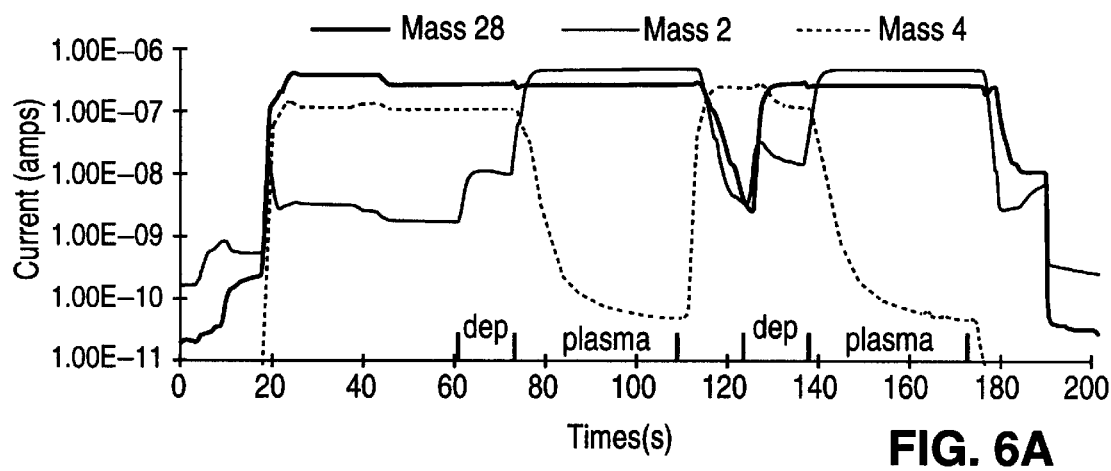
FIGS. 6A–6C are plots of various measurements versus time resulting from the deposition process of FIGS. 5A–5D.
Figure 6B:
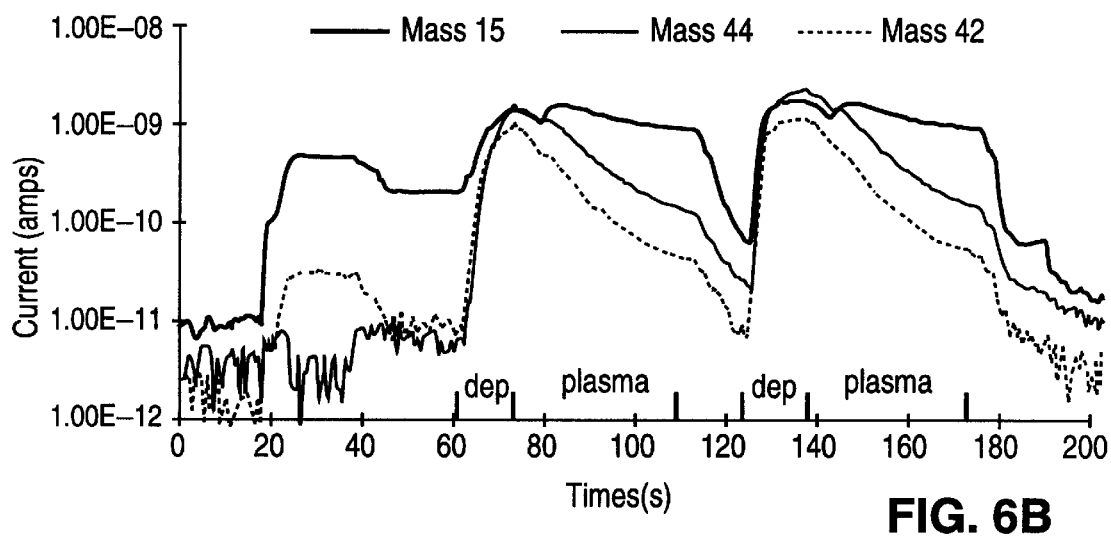
Figure 6C:
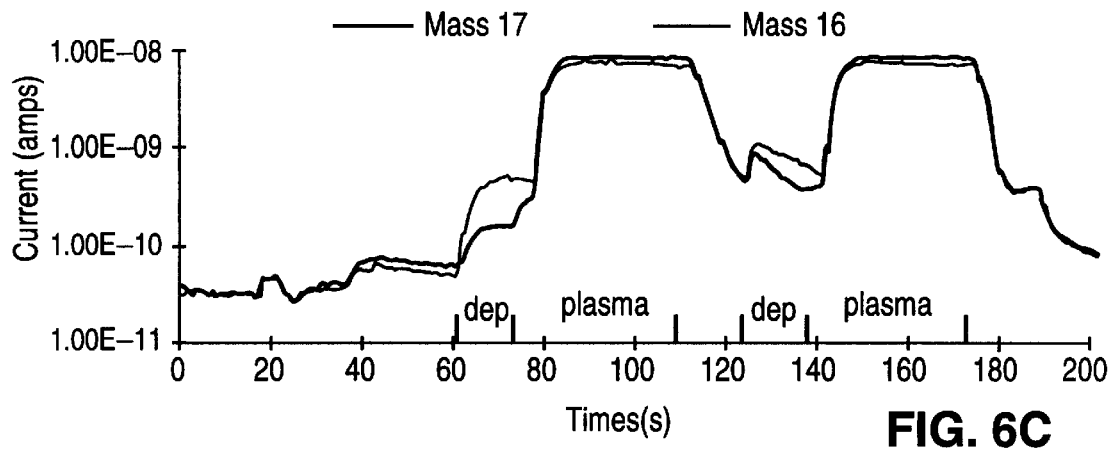
Figure 7A:
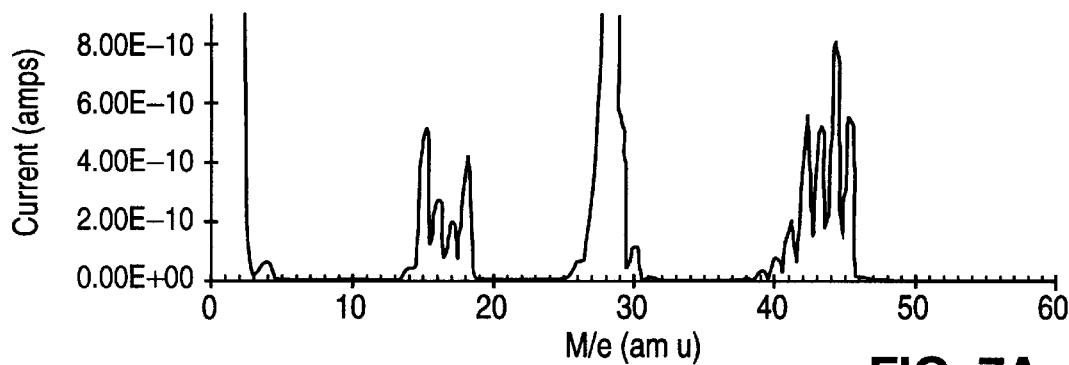
FIGS. 7A–7D are plots of mass spectra at different electron energy during TiN deposition.
Figure 7B:
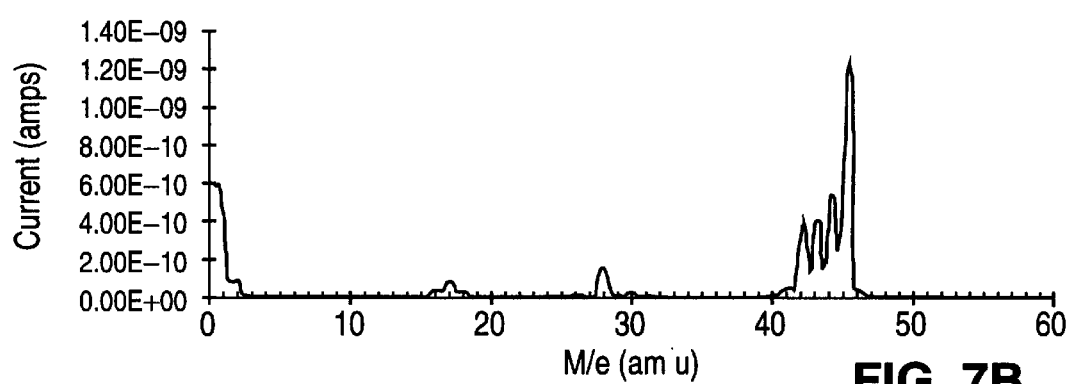
Figure 7C:
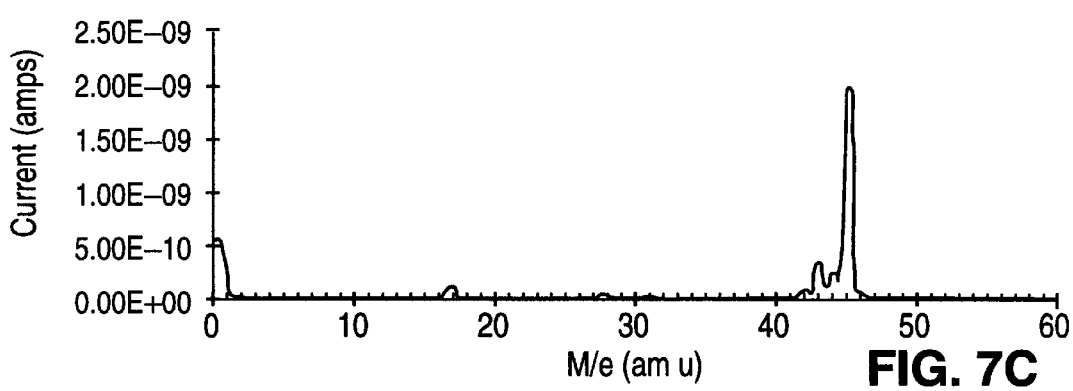
Figure 7D:
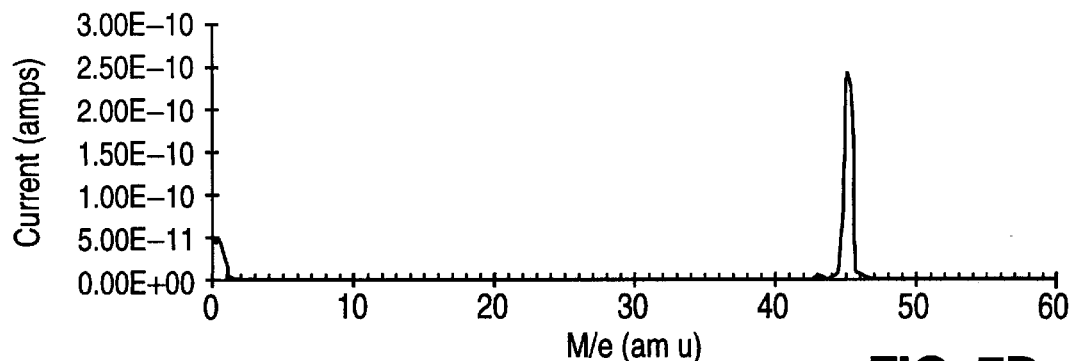

FIGS. 6A–6C shows the signal intensity trend of some of the mass peaks just mentioned during a two-layer deposition. The trend of peaks 28, 2, and 4 shown in FIG. 6A corresponds very well to the trend of the flow rates of $N_2$ gas, $H_2$ gas, and He gas shown in FIGS. 5B–5C, showing every change in the gas flows. The fact that it takes some time for the signals of $N_2$, $H_2$, and He peaks to drop to baseline indicates a non-zero system pump-down time. Notice that when the deposition is started, the mass 2 peak signal increases by one order of magnitude even though there is no external $H_2$ gas flow in this step. This signal corresponds to the hydrogen byproduct of TDMAT decomposition. A comparison of FIGS. 6A–6B indicates that peaks 44 and 43 decay at a slower rate than $N_2$, $H_2$ and He peaks. This could be due to slower pumping-down rates of their underlying species because of their larger molecular weights, or to the continuous outgassing of the underlying species from chamber wall, shower head, and wafer surface. The mass 15 peak signal is interesting in that following a deposition cycle it first decreases and then increases again when the $H_2/N_2$ plasma is started. This is because the ammonia generated in the plasma contributes to mass 15 peak signal as one of its fragments is $NH^+$. In other words, mass 15 peak consists of two parts: $CH_3^+$ from TDMAT decomposition and $NH^+$ from ammonia. The mass 15 peak signal slowly decreases as the part from TDMAT decomposition is decreasing.

In FIG. 6C, the trends of mass 17 and 16 peaks are shown. We notice when deposition starts, there are noticeable increases in the mass 16 peak signal and mass 17 peak signal, which can be attributed to TDMAT decomposition byproducts. Following the depositions, the signals of mass 16 and 17 peaks increase dramatically once the plasma power is turned on, which occurs at about 80 and 140 seconds for the first and second plasma cycles, respectively. The occurrence of peaks 17 and 16 is attributed to gas phase reaction of $H_2$ and $N_2$ in the plasma to form ammonia.

In the subsequent sections, the focus is on processes involving depositions only, i.e., without plasma treatment following depositions. The RGA response to process parameters is investigated, such as He carrier flow and temperature, which affect the deposition rate.

Identification Methods

As set forth above, the CVD TiN process used in the present application is a thermal decomposition of tetrakis dimethylamino titanium (TDMAT), (($CH_3)_2N)_4Ti$, followed by plasma densification. It is important to identify the byproducts of this process and their concentration. Two methods for identifying the byproducts of the thermal decomposition of TDMAT are studied: the appearance energy method and spectrum peak ratio method.

Before detailing these methods, it was first necessary to find out the possible molecules that make up the byproducts. To do this, as discussed above with reference to FIGS. 4A–4C, we scanned a wide RGA spectrum range from 0 to 150 atomic mass units (amu) and reviewed it. Typically, the ion current peaks will distribute as several groups. Each group is a set of molecules and its fragments. For each amu peak, we identified a possible molecular combination. The National Institute of Standards and Technology (NIST) maintains a database of amu combinations at the Internet web address<http://webbook.nist.gov/chemistry/mw-ser.htm>. For example, when we found the mass 45 amu peak in the RGA spectrum, this corresponds to 54 different molecules in the NIST database.

To find the right molecule corresponding to the deposition byproduct is not a simple manner. This requires our method to identify them. In this case, based on the composition of TDMAT as well as other literatures, we will select methanamine, N-methyl- (or dimethylamine) as one of the possible byproducts of TDMAT. The two identification methods are the appearance energy method and the peak ratio plot method.

Appearance Energy

The appearance energy method is based on observing the RGA spectra with different applied electron ionization energies. NIST maintains a database of appearance energy data and gas phase ion energetics data. The appearance energy method applies a minimized electron energy to barely ionize the byproduct without generating other fragments. Since different molecules have different structures, the required energy to ionize will be different. Typically, the larger the molecular weight, the lower the appearance energy.

The magnitude of the applied electron ionization energy was divided into two cases: the low-energy case (less than 35 eV) and the high-energy case (above 35 eV). In the low-energy case, the CVD TiN byproducts were identified by the appearance energy. The electron ionization energy was varied to determine the minimum energy to ionize the gas species without generating other fragments. The gas species $H_2$, He, $CH_4$, $NH_3$, $N_2$, dimethylamine, ethylenimine, and acetonitrile (and their corresponding fragments) were identified as byproducts in the TDMAT thermal decomposition process.

Four combinations of electron multiplier voltages and electron ionization energies were used to obtain the thermal decomposition spectra of TDMAT: 1600 V and 25 eV, 1800 V and 15 eV, 2000 V and 12 eV, and 2000 V and 10 eV, see FIGS. 7A–7D. (The electron multiplier voltage was increased for electron energies below 25 eV to improve the detector gain.) Data was reviewed for masses below 50 amu, because these peaks have the highest ion current. Peaks at 28 amu and 4 amu are attributed to nitrogen and helium carrier gases.

In the case of 25 eV electron ionization energy (FIG. 7A), many peaks were observed. This spectrum was a combination of the byproducts of the CVD reaction and the fragmentation of the gas molecules during the ionization process. Overall, we can divide these peaks into four amu regions. The amu regions are defined as the following: Group I ranges from 1 to 4 amu, Group II from 14 to 18 amu, Group III from 26 to 30 amu, and Group IV from 38 to 45 amu. He and $H_2$ are in Group I; $CH_4$, $NH_3$ and some fragments (e.g., $NH_4^+$) are in Group II; $N_2$ and some fragments (e.g., $C_2H_4^+$) are in Group III; and dimethylamine, ethylenimine, and acetonitrile are in Group IV. The He peak (at 4 amu in Group I) is barely observed, because its appearance energy (24.56 eV) is close to the applied electron ionization energy. This is a good example of the appearance energy concept. (Also, to understand the related concept of peak ratio detailed below, we can inspect those peaks in Group IV and observe a ratio relation between these peaks.)

When the electron ionization energy is 15 eV (FIG. 7B), the peaks in Group I, II and III masses are not observed. We find $H_2$ peak (2 amu) in Group I decreases significantly because the appearance energy of $H_2$ is 15.42 eV. The ion current is reduced in comparison to the spectra at 25 eV for 16 and 17 amu, because the applied electron ionization energy is only slightly higher than the appearance energy of $CH_4$ (16 amu and 12.6 eV) and $NH_3$ (17 amu and 10.45 eV). Also, the peaks in Group III have dropped significantly with only 28 amu peak observable, because the appearance energy of $N_2$ is 15.65 eV. For electron energies below 15 eV, the peak at 28 amu may be from other sources, such as $C_2H_4^+$ from ethylenimine ($NC_2H_5$) fragments, where the appearance energy is 13.3 eV.

For Group IV at 15 eV, there are four dominant peaks at masses 42, 43, 44 and 45 amu. These peaks are attributed to dimethylamine, ethylenimine and acetonitrile, mainly from removing one hydrogen atom of dimethylamine and ethylenimine. The appearance energy values from the NIST database agree with the observations at 15 eV. The ion current of the peak at 45 amu changes relative to the ion current of the peak at 44 amu when the electron energy is changed from 25 eV to 15 eV. At 25 eV, the signal of mass 44 peak is higher than the signal of mass 45 amu peak, but at 15 eV this trend is reversed. This observation may be explained by looking at the appearance energies for peaks at 45 amu ($C_2H_7N^+$, 8.83 eV) and 44 amu ($C_2H_6N^+$, 9.65 eV). Since the appearance energy of $C_2H_7N^+$ is less than $C_2H_6N^+$ by 0.82 eV, the relative ion current of peak 45 amu and peak 44 amu changes as the electron energy is decreased. In fact, the peak at 45 amu is still observed at an electron energy of 10 eV (more fully discussed below), while the peak at 44 amu is not detected. The peak at 41 amu, corresponding to acetonitrile, is small. But this is expected since the appearance energy is 12.38 eV. Low signal of the peak at 41 amu may be due to the low concentration or that the appearance energy is actually higher.

If the applied electron ionization energy is reduced to 12 eV (FIG. 7C), only Group IV peaks are observed. In fact, the mass 45 amu peak has the highest ion current and peaks at 44, 43 and 42 amu are reduced significantly. Further reducing the electron ionization energy to 10 eV (FIG. 7D) gives an observation of only peak at 45 amu. We expected to observe peaks for $C_2H_6N^+$ and $C_2H_5N^+$ because their appearance energies are less than 10 eV. Possible reasons why we don't see these peaks are: (1) the actual appearance energy is slightly higher than 10 eV, or (2) the signal is lower than the detectable limit.

This appearance energy data observed corresponds to that reported in the NIST database. The individual assignments for the gas species are consistent with the RGA data reported thus far. Dimethylamine, ethylenimine, and acetonitrile are some of the byproducts of TDMAT thermal decomposition.

Studying the byproducts by appearance energy method is simple because one byproduct does not mix with other fragments. However, one problem for the appearance energy method is the poor signal to noise ratio. Because of the low electron energy, the number of ions is low; therefore, the detected ion current is low. In order to obtain the signal, we need to use longer dwell time, which results in fewer collected data points, and higher EM voltage, which results in a shorter EM lifetime.

Peak Ratio Plot

The peak ratio plot method operates by combining the ionization spectra of species from the NIST database to obtain the ionization spectrum resulting from the deposition process. To obtain the mass spectrum, the molecule needs to be ionized first. The ionization is a function of the electron ionization energy and the molecular structure. Usually, the spectrum becomes complicated when the mass of molecule becomes large. The electron ionization energy can affect the spectrum result in two different extreme cases, the low-energy case and the high-energy case. In the high-energy case, electrons can break the molecules into many different fragments and result in many ion current peaks with different atomic masses. If a chemical reaction generates many byproducts, then its mass spectrum is a combination of these byproducts and their fragments. At first glance this seems to be a very complicated situation with which to analyze the spectrum. However, if one knows the byproducts, in many cases one can find their correspondent mass spectra from a database such as the NIST mass spectra database.

For example, one can find the mass spectrum for dimethylamine obtained at an electron ionization energy of 70 eV. Besides a peak at 45 amu, many sub-peaks were observed. In fact, the strongest peak is at 44 amu, which should be the major fragment of dimethylamine. To analyze a measured spectrum, such as TDMAT thermal decomposition process, we need to make an initial guess of the byproducts. With the knowledge of each byproduct's spectrum, we can combine them together to make a calculated plot. Since for many high mass byproducts their characteristic mass spectra have many peaks, to simplify the analysis, we only considered the first four to six peaks near the mass of a byproduct. Such a simplification is reasonable because the concentration of low-mass fragments is low. Also, it is difficult to calculate the spectrum on the low-mass end, because it is hard to fit the data with many byproducts and their associated fragments. Finally, to construct the calculated spectrum, we applied the concentration ratio to different byproducts. A good fit of data not only verified the byproducts, but also revealed their relative concentration ratio.

A high electron energy setting (above 35 eV) was used to identify the gaseous species using the peak ratio method of analysis. The RGA spectra from the thermal decomposition of TDMAT were compared with the cracking pattern of pure gases. A typical chemical reaction will generate many byproducts and its mass spectrum is the combination of different gas species. Analysis of the RGA spectra is difficult to do without prior knowledge of the reaction byproducts; however, comparison of the cracking pattern of dimethylamine, ethylenimine, and acetonitrile has yielded a model that fits the observed spectrum.

A 60-second deposition was performed to obtain a steady state signal from the RGA. This deposition time was chosen to mitigate diffusion effects of the RGA sampling system. Typically, after 25 seconds of the deposition, the Group IV peaks will reach a steady state. The electron multiplier voltage was 1650 V, the electron energy was 35 eV, and a 32 ms dwell time was used. An average of 51 scans was used to obtain the relative ratio of the peaks.

The average signal intensity of the peaks are shown in Table 1. All the peak intensities are normalized to the 44 amu peak. The third column is the normalized RGA ion current data and the last column is the normalized mass spectrum calculated by this technique. The last row of the table lists the ionization concentration, which is defined as the total number of ionized molecules in the ionization volume of RGA. The ionization concentration was equal to the product of the ionization coefficient times the concentration of neutrals in the RGA ionization volume. Because the peak ratio method gives us the relative ion concentration, if we know the ionization coefficient of each byproduct then we can obtain the actual neutral byproduct concentration. In Table 1, the ionization concentration values were arbitrary numbers, which are assigned to obtain the best fit to the actual spectra. The contribution of the cracking pattern of each gas species is added to form the total spectra. The theoretical spectrum can be constructed with all these peaks. By varying the ionization ratio to the best fit to the observed data, the ratio of $NC_2H_7:NC_2H_5:NC_2H_3$ was 11:5.5:1.8 (or approximately 6:3:1).

TABLE 1

The measured RGA peak intensity and the calculated mass spectrum peak intensity.

| | RGA | | Dimethylamine $NC_2H_7$ (AMU = 45) | | Ethylenimine $NC_2H_5$ (AMU = 43) | | Acetonitrile $NC_2H_3$ (AMU = 41) | | | |
|---|---|---|---|---|---|---|---|---|---|---|
| amu | Intensity, ion current (×10 nA) | Normalize RGA Intensity | $NC_2H_7$ peak ratio (%) | $NC_2H_7$ peak ratio × ionization concentration | $NC_2H_5$ peak ratio (%) | $NC_2H_5$ peak ratio × ionization concentration | $NC_2H_3$ peak ratio (%) | $NC_2H_3$ peak ratio × ionization concentration | TOTAL Mass Spectrum Intensity | Normalized Mass Spectrum Intensity |
| 45 | 84.76 | 0.583 | 63.50 | 698.50 | 0.00 | 0.00 | 0.00 | 0.00 | 699 | 0.627 |
| 44 | 145.43 | 1.000 | 100.00 | 1100.00 | 2.42 | 13.31 | 0.00 | 0.00 | 1113 | 1.000 |
| 43 | 74.80 | 0.514 | 11.40 | 125.40 | 60.00 | 330.00 | 0.00 | 0.00 | 455 | 0.409 |
| 42 | 90.49 | 0.622 | 12.67 | 139.37 | 100.00 | 550.00 | 3.00 | 5.40 | 695 | 0.624 |
| 41 | 48.33 | 0.332 | 2.68 | 29.48 | 26.20 | 144.10 | 100.00 | 180.00 | 354 | 0.318 |
| 40 | 28.56 | 0.196 | 2.78 | 30.58 | 18.30 | 100.65 | 54.90 | 98.82 | 230 | 0.207 |
| 39 | 14.04 | 0.097 | 0.00 | 0.00 | 7.60 | 41.80 | 19.00 | 34.20 | 76 | 0.068 |
| 38 | 7.63 | 0.052 | | | | | | | | |
| | Ionization Concentration | | | 11.0 | | 5.5 | | 1.8 | | |

In summary, the byproduct identification using the appearance energy and peak ratio technique has been demonstrated. The appearance energy technique was used to identify the byproducts of the thermal decomposition of TDMAT which are dimethylamine, ethylenimine, and acetonitrile. The peak ratio method was used to identify the byproducts and the relative concentration of each. The relative ionization concentration ratio between the three byproducts mentioned above is about 6:3:1.

Helium Carrier Flow and Heater Temperature

Once the candidate species have been identified, RGA measurements of these species can be correlated with the deposition process. A two-factor, five-level experimental design was performed. The He carrier gas flow and the heater temperature had the following parameter settings: 1) 75, 125, 225, 325 and 375 sccm, and 2) 430, 440, 450, 460 and 470° C., respectively. The wafer sequence is given in Table 3 for the 470° C. leg of the experiment. The purpose of the first wafer was to condition the chamber and the second wafer was used for optical and sheet resistance (Rs) measurements. The heater temperature was allowed to stabilize for 30 minutes while the idle purge recipe was active. Optical thickness and the mean Rs values of the first and second wafers were within 5% of each other, which indicates that the heater temperature was stable. Heater temperature was tracked using Brookside tool data collection software and in most cases the heater temperature was within ±1° C. of the set point. One exception to this was during the 440° C. leg of the experiment, where the heater temperature varied ±2.5 ° C. The DOE was performed just prior to a CVD TiN PM to avoid particle and temperature stability issues.

TABLE 3

Wafer sequence employed for the 470° C. leg of the DOE.

| Cass/Run | type | Heater Temp | He Carr Flow | He Dil Flow |
|---|---|---|---|---|
| C1-1 | condition | 470 | POR | POR |
| C1-2 | dep only | 470 | 225 | 375 |
| C1-3 | dep only | 470 | 375 | 125 |
| C1-4 | dep only | 470 | 125 | 375 |
| C1-5 | −M | 470 | POR | POR |
| C1-6 | dep only | 470 | 325 | 175 |
| C1-7 | dep only | 470 | 75 | 425 |

Optical Thickness

Figure 8:
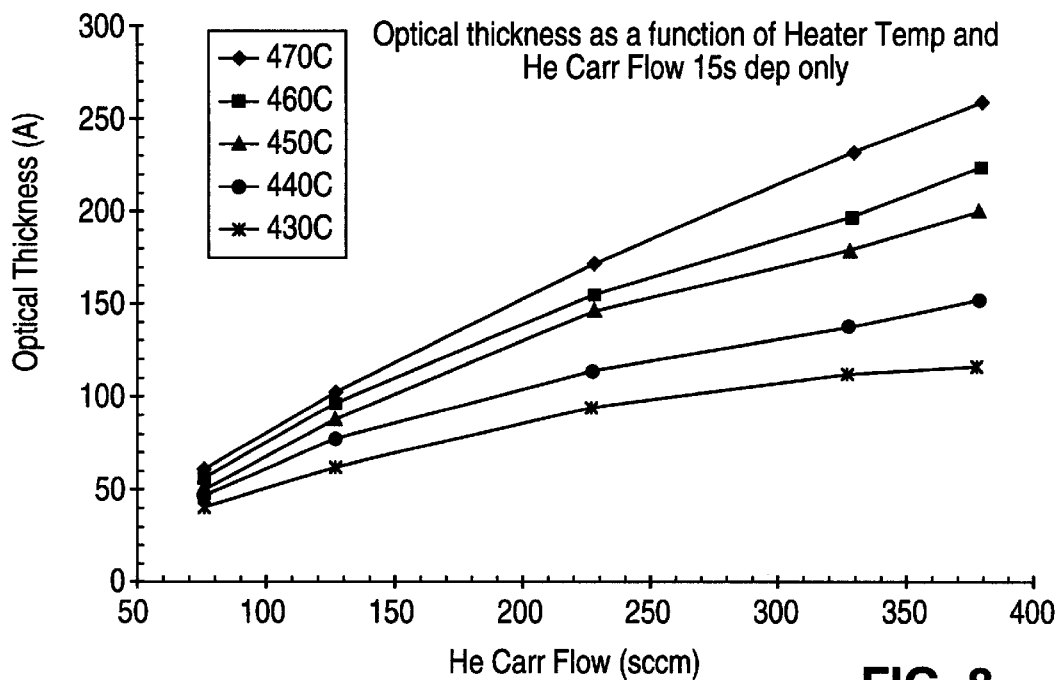
FIG. 8 is a plot of optical thickness versus flow rate resulting from a deposition.

Deposition rate is a strong function of the He carrier flow and heater temperature as shown in FIG. 8. For example, at 450° C. heater temperature, the deposition rate varies from 3.33 Å/s to 13.33 Å/s when the He carrier flow is changed from 75 sccm to 375 sccm. For low flow rates (e.g., less than approximately 125 sccm), the heater temperature has a small effect on deposition rate, but for flow rates above 225 sccm heater temperature has a stronger effect. This phenomenon demonstrates the balance between transport limited and mass transport limited deposition; i.e., at low flow rates the deposition rate is less dependent on temperature (transport limited), and at high flow rates the process is a strong function of temperature (reaction rate limited).

The RGA is very sensitive to any changes in the He carrier flow rate and heater temperature that affect TiN film thickness. This is the first evidence that shows that an RGA can be employed to monitor the deposition rate of the CVD TiN process.

Figure 9:
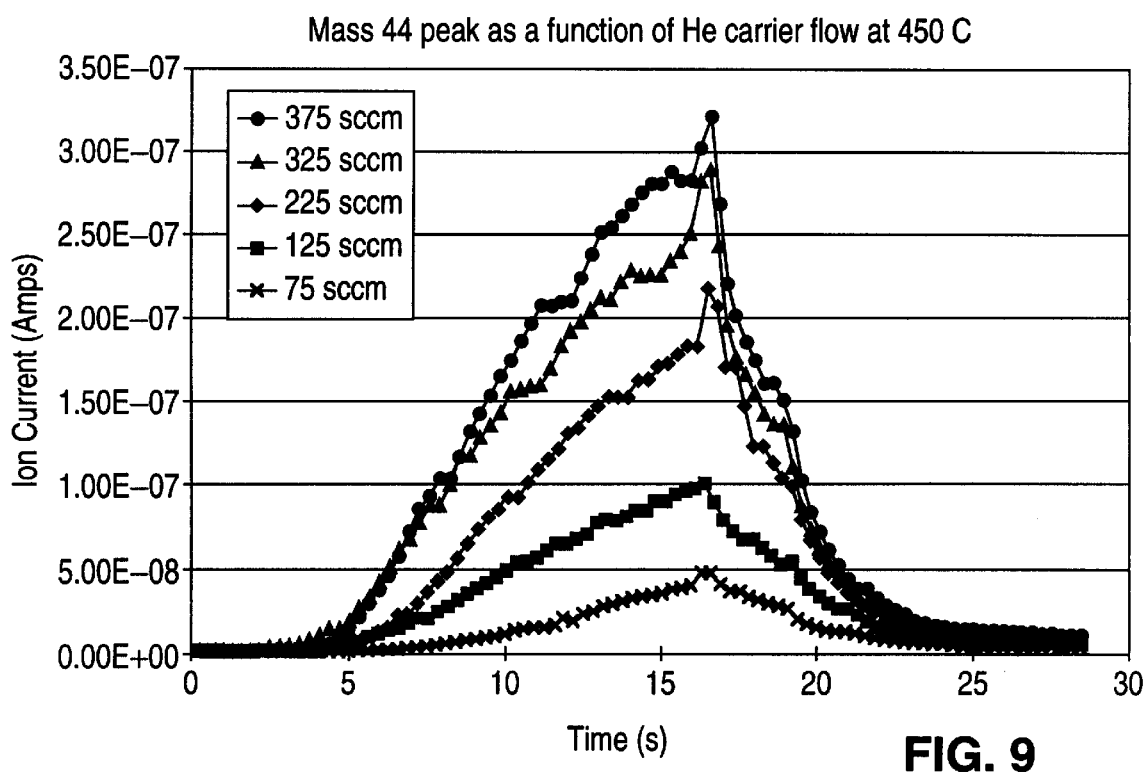
FIG. 9 is a plot of ion current versus time resulting from a deposition.

FIG. 9 shows a trend chart of the raw data for mass peak 44 as a function of time during a deposition. The different curves illustrate the dependence of He carrier flow. The heater temperature was held fixed at 450° C. TDMAT is delivered to the reactor using a bubblier system with He as the carrier gas. The intensity of mass 44 peak increases as the He carrier flow is increased. Dimethylamine has been identified as one of the reaction products of the thermal decomposition of TDMAT. The uptake of TDMAT into the reactor is proportional to the He carrier flow and the RGA spectra shows this effect.

FIG. 9 reveals that the form of the ion current as a function of time is largely unchanged for the deposition parameters investigated. On a linear scale, the shape of the curve is triangular. As the He carrier flow or the heater temperature is increased, the height and area under the curve increases. In order to correlate the RGA data with these parameters, the maximum ion current at the end of the deposition is compared.

Figure 10:
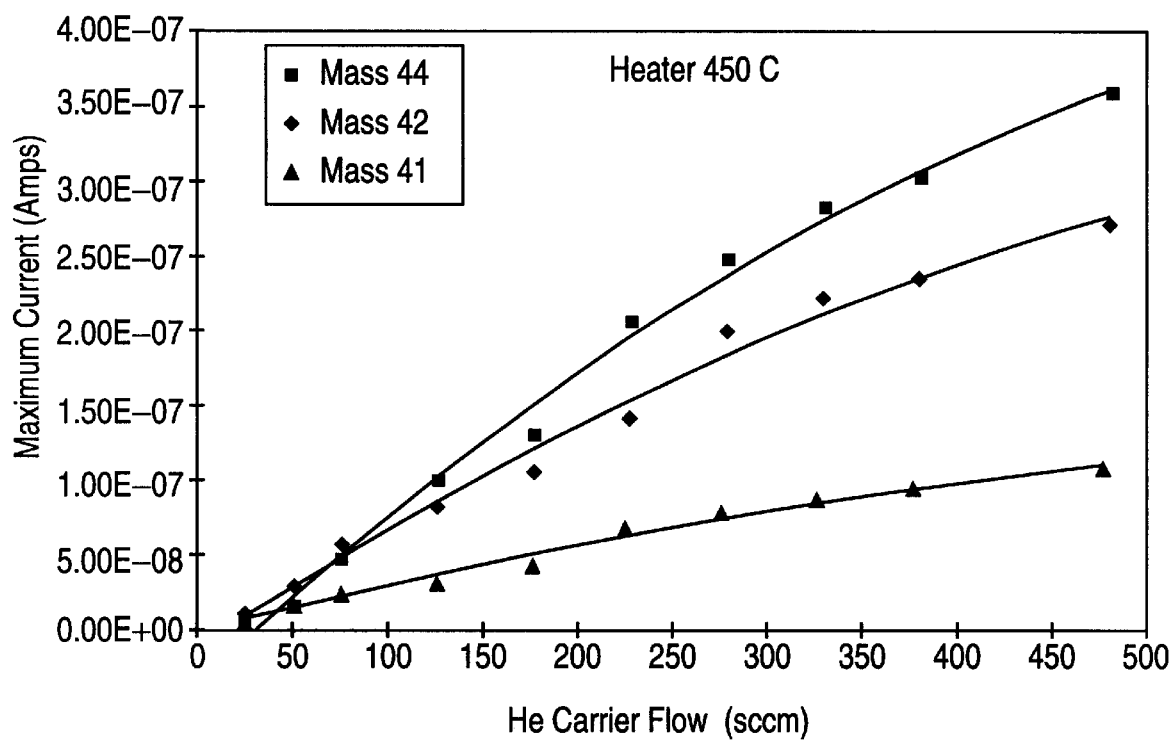
FIG. 10 is a plot of ion current versus flow rate resulting from a deposition.

FIG. 10 shows the maximum ion currents for mass 44, 42 and 41 peaks at the end of the deposition as a function of He carrier flow. A monotonic increase in the peak intensity is observed when the He carrier flow is increased which indicates that the RGA is sensitive to the delivery of the feed stock gas or the byproducts of the CVD reaction.

Figure 11:
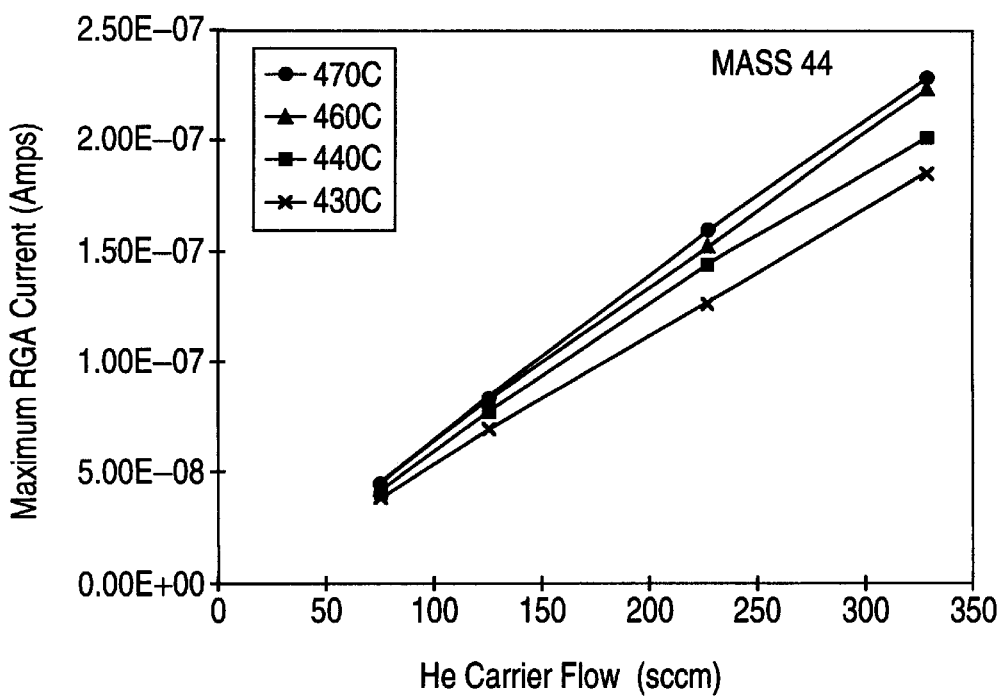
FIG. 11 is a plot of ion current versus flow rate resulting from a deposition.

FIG. 11 shows the maximum ion current for mass 44 at the end of the deposition as a function of He carrier flow and heater temperature. Within the parameter space investigated, this data indicates that the primary effect on the ion current is from the variation of He carrier gas flow and that the heater temperature variation has less of an effect.

Figure 12A:
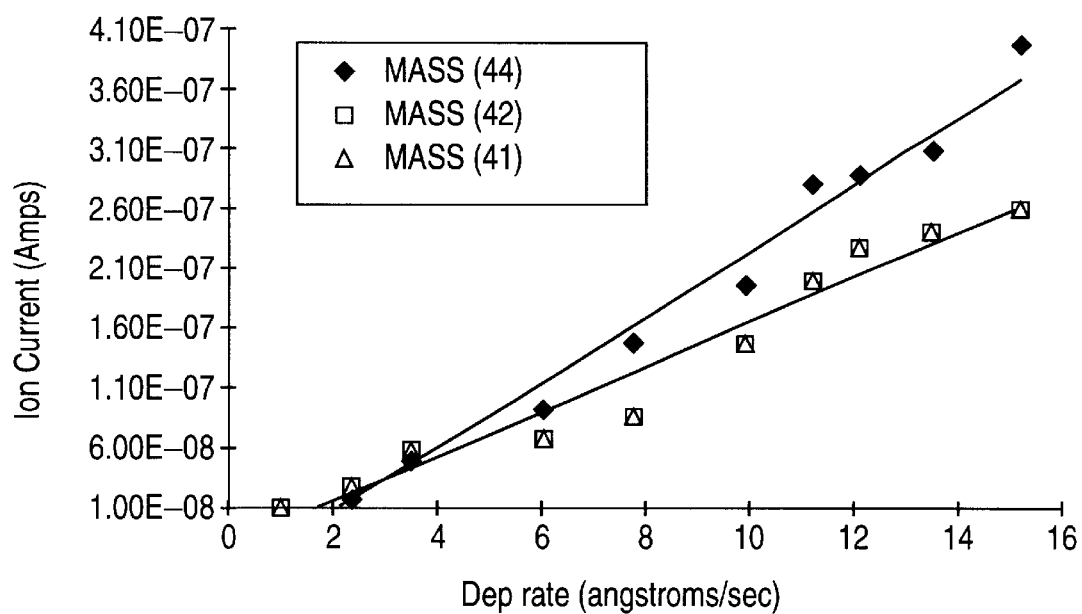
FIGS. 12A–12C are plots of ion current versus deposition rate resulting from a deposition.
Figure 12B:
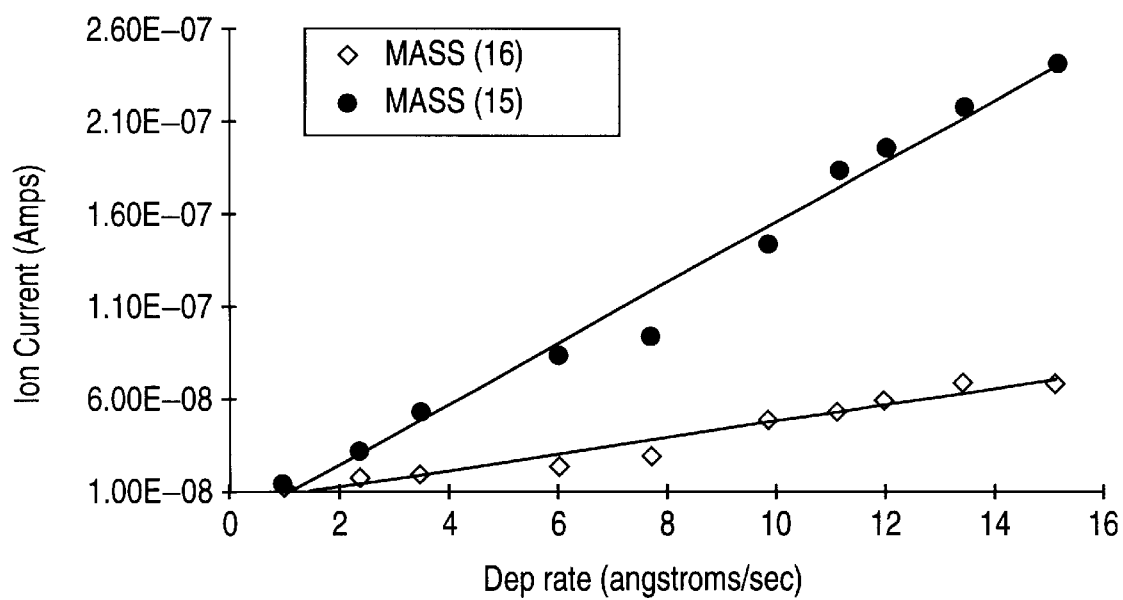
Figure 12C:
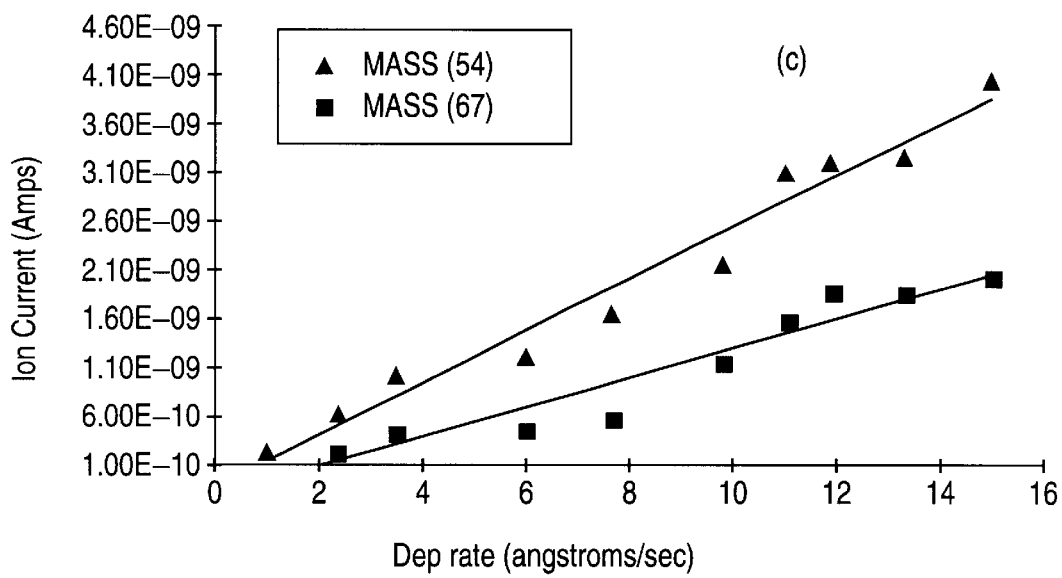

The trend of the RGA data is very similar to the optical thickness of untreated films as a function of heater temperature and He carrier flow. FIG. 12A shows the correlation between the ion currents of mass peaks 44, 42, and 41 with film optical thickness. This data shows a monotonic increase in the maximum ion current with the optical thickness. The correlation is linear. FIG. 12B shows the correlation of the maximum ion current for mass 15 peak ($CH_3^+$) and mass 16 peak ($CH_4^+$) with deposition rate for deposition only CVD TiN films. FIG. 12C shows the same correlation for the peaks at 54, 67, and 106 amu. The R-square parameter from the linear fit of this data is high, as shown in Table 4 for each mass peak, indicating an excellent correlation. The deposition rate varies from 3 Å/s to 17 Å/s for the process parameters investigated. The specification of deposition rate for untreated CVD TiN films is 9 Å/s±1.33 Å/s, thus from a statistical process control perspective, this data spans the entire range of interest.

| Mass Peak | Slope (Amp/Å) | Intercept (Amp) | R-square |
|---|---|---|---|
| 44 | $1 \times 10^{-9}$ | $3 \times 10^{-8}$ | 0.96 |
| 42 | $8 \times 10^{-10}$ | $3 \times 10^{-9}$ | 0.98 |
| 41 | $3 \times 10^{-10}$ | $4 \times 10^{-9}$ | 0.97 |
| 15 | $7 \times 10^{-10}$ | $9 \times 10^{-9}$ | 0.96 |

Table 4. R-square parameter for mass peaks 44, 42, 41 and 15. Linear fit of RGA data as a function of deposition rate as shown in FIGS. 12A–12C.

FIGS. 12A–12C show a monotonic increase in the peak intensity when the He carrier flow is increased which indicates that the RGA is sensitive to the delivery of the feed stock gas and the byproducts of the CVD reaction. This data indicates that the primary affect on the ion current is from the variation of He carrier gas flow and that the heater temperature variation has less of an effect. In general, the peak current increases as a function of heater temperature.

Figure 13:
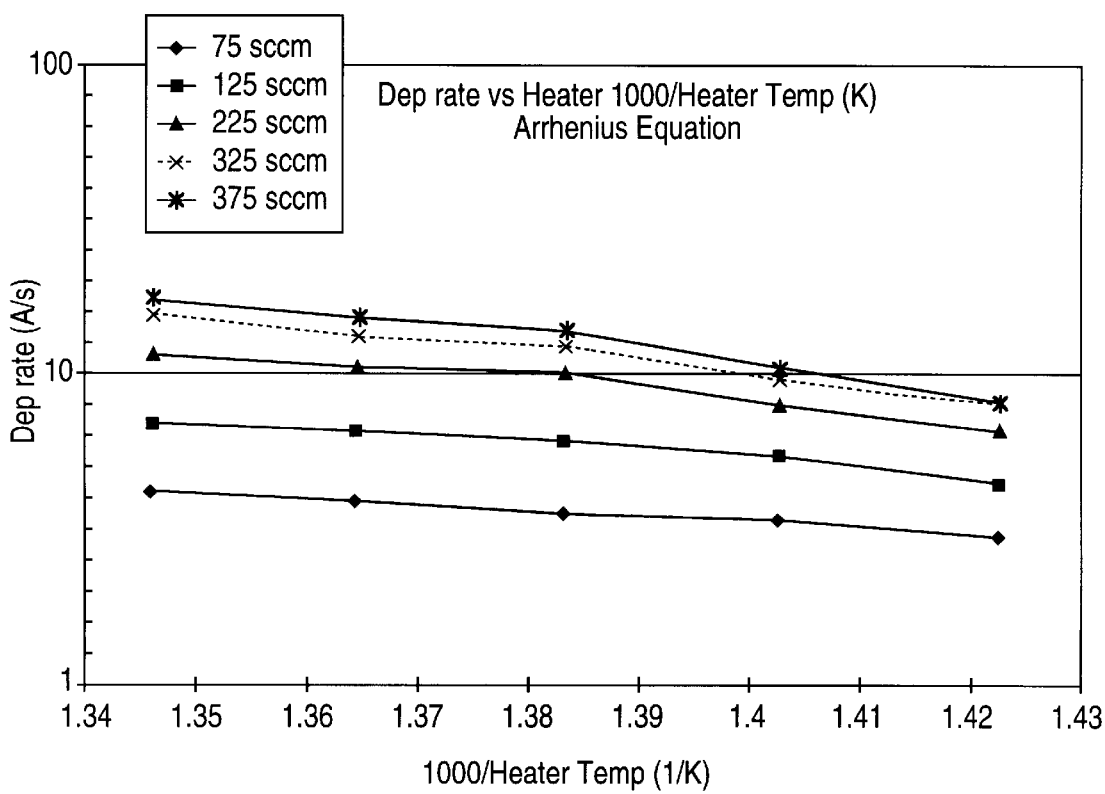
FIG. 13 is a plot of deposition rate versus temperature resulting from a deposition.

FIG. 13 shows an Arrhenius plot of the deposition rate as a function of the heater temperature for different He carrier flow rates. A change in slope is seen around 450° C. for He flow rates above 225 sccm. The change in slope clearly shows the demarcation between mass transport limited and reaction rate limited growth. The TxZ chamber was designed to operate in the reaction rate limited region because the optical thickness uniformity is a minimum there. The heater was designed to have a very good temperature uniformity across the wafer.

Conclusion

The use of an RGA in the manufacturing of thin films for the semiconductor industry provides a method to improve the quality of the product, because it can be used as a real-time deposition rate monitor. The deposition rate monitor technique was empirically derived for the CVD TiN process. The dependence of optical thickness on the various deposition parameters was studied and the correlation between ion current, as measured by the RGA, and the optical thickness of the films was determined. In CVD reactors, physical properties of the thin films are varied by controlling the pressure, and flow of gas species within the CVD reactor. The RGA can be used to monitor the gas phase species to vary film parameters such as composition, refractive index, and deposition rate.

This work shows the response of the RGA ion currents of deposition byproducts with change in the process variables that affect macroscopic film properties, such as film thickness. The peak intensities of peaks at masses 44, 42, 41 15, 67, 54, and 106 amu increase monotonically as a function of the deposition rate. This correlation is important because it shows that the RGA may be used as a real time monitor of the CVD TiN process.

The deposition process was examined as a function of TDMAT flow and substrate temperature. In particular, an RGA was employed to study the gaseous environment during film growth. The ionization and fragmentation of the TDMAT molecule was studied using an RGA. Byproducts of the thermal decomposition of TDMAT were identified. A correlation was found between the RGA ion current for selected peaks and the thin film deposition rate. The peaks at masses 44, 42, 41, 15, 15 67, 54, and 106 amu are associated with the fragmentation of TDMAT by the RGA. These fragments are also related to the thermal decomposition of TDMAT. Appearance energy studies and peak ratio plot calculations indicate that acetonitrile, dimethylamine and ethylenimine are byproducts of the CVD TiN deposition process. Changing the TDMAT flow rate and the substrate temperature varied the deposition rate. RGA peaks associated with the above mentioned hydrocarbons gas species increase monotonically as a function of the deposition rate. This correlation is important because it shows that RGA can be used as a real time in-situ monitor of the CVD TiN deposition rate. This technique may be used as an in-situ, real-time monitor of the deposition rate of CVD TiN films without having to use test wafers. These results show the capability of the RGA to be employed as a passive data collection tool to monitor process stability. These methods show that the RGA may be employed as a fault detection or statistical process control tool.

It should be understood that various alternatives to the embodiments of the invention described herein may be employed in practicing the invention. It is intended that the following claims define the scope of the invention and that structures within the scope of these claims and their equivalents are covered thereby.

What is claimed is:

1. A method of correlating resulting gaseous environments in a chemical vapor deposition (CVD) reactor with physical properties of deposited films, comprising the steps of:
   depositing a film in the CVD reactor at a selected temperature utilizing a selected input gaseous mixture;
   measuring a resulting gaseous environment in the CVD reactor as a result of the depositing step, wherein said step of measuring said resulting gaseous environment includes:
      selecting a gas species having a corresponding appearance energy;
      generating an ionization energy corresponding to said appearance energy, as a result of the depositing step; and
      detecting said gas species;
   measuring a physical property of the deposited film; and
   correlating one or more gas species in said resulting gaseous environment, said selected temperature, and said selected input gaseous mixture with said physical property to identify a relationship therebetween.

2. The method of claim 1, wherein:
   said selected temperature is between approximately 430 and 470 degrees Celsius; and
   said selected input gaseous mixture includes a helium carrier gas flow of between approximately 75 and 375 sccm.

3. The method of claim 1, wherein said depositing step comprises:
   depositing a film of titanium nitride (TiN) at said selected temperature and with said selected input gaseous mixture.

4. The method of claim 1, wherein said step of measuring a physical property comprises:
   measuring a thickness of said film.

5. The method of claim 1, wherein said correlating step comprises:
   identifying a plurality of gas species resulting from said depositing step; and
   determining said one or more gas species from said plurality of gas species based on a correlation to said physical property for said selected temperature and said selected input gaseous mixture.

6. The method of claim 1, further comprising the steps of:
   before said depositing step, inserting into the chemical vapor deposition reactor a wafer on which said film is to be deposited; and
   before said step of measuring said physical property, removing said wafer from said chemical vapor deposition reactor.

7. The method of claim 1, further comprising the step of:
   successively performing a plurality of times said steps of depositing, measuring said resulting gaseous environment, measuring said physical property, and correlating, for a plurality of selected temperatures and a plurality of selected input gaseous mixtures, resulting in a plurality of measurements of said physical property and a plurality of measurements of said one or more gas species,
   wherein said step of successively performing results in data for a correlation table between said plurality of selected temperatures, said plurality of selected input gaseous mixtures, said plurality of measurements of said physical property, and said plurality of measurements of said one or more gas species.

8. The method of claim 1, wherein said step of correlating comprises:
   correlating one or more gas species ratios in said resulting gaseous environment, said selected temperature, and said selected input gaseous mixture with said physical property to identify a relationship therebetween.

9. A method of monitoring depositions of films in a chemical vapor deposition (CVD) reactor, comprising the steps of:
   providing a correlation table between a plurality of temperatures, a plurality of input gaseous mixtures, a plurality of physical properties of deposited films, and a plurality of resulting gaseous environments;
   designating a physical property of a film to be deposited;
   referencing with said correlation table a selected one of said plurality of temperatures, a selected one of said plurality of input gaseous mixtures, and a range of one or more gas species of said plurality of resulting gaseous environments in accordance with said designated physical property;

depositing said film in the CVD reactor at said selected temperature utilizing said selected input gaseous mixture;

measuring one or more gas species in a resulting gaseous environment in the CVD reactor that results from said depositing step, wherein said step of measuring includes:

selecting a gas species having a corresponding appearance energy;

generating an ionization energy corresponding to said appearance energy, as a result of the depositing step; and detecting said gas species;

comparing the measured one or more gas species in said resulting gaseous environment and said range of one or more gas species; and generating a comparison result in accordance with said comparing step, wherein said comparison result indicates a difference between said designated physical property and an actual physical property resulting from said depositing step.

10. The method of claim 9, wherein:

said physical property is a thickness of said film.

11. The method of claim 9, further comprising the step of:

before said depositing step, measuring one or more gas species in a pre-deposition gaseous environment.

12. The method of claim 9, wherein:

said one or more gas species have molecular masses of at least one of 15, 41, 42, 44, 54, 67, and 106 atomic mass units.

13. The method of claim 9, wherein said depositing step comprises:

depositing a film of titanium nitride (TiN) at said selected temperature and with said selected input gaseous mixture.

14. The method of claim 9, wherein said comparing step comprises:

determining a value of a first gas species of said one or more gas species; and comparing said value and said range for said first gas species.

15. The method of claim 9, wherein said steps of referencing, measuring, and comparing comprise:

referencing with said correlation table said selected temperature, said selected input gaseous mixture, and a range of one or more gas species ratios of said plurality of resulting gaseous environments in accordance with said designated physical property;

measuring one or more gas species ratios in a resulting gaseous environment as said result of said step of depositing; and comparing said one or more gas species ratios in said resulting gaseous environment and said range of one or more gas species ratios.

16. The method of claim 9, further comprising the steps of:

successively performing a plurality of times said steps of depositing, measuring, and comparing; and generating a plurality of overall comparison results in accordance with said plural steps of comparing, wherein said plurality of overall comparison results provide statistical information on the depositions performed in said plural steps of depositing.

* * * * *